US012736383B2

(12) United States Patent
Honniball et al.

(10) Patent No.: US 12,736,383 B2
(45) Date of Patent: Sep. 15, 2026

(54) PRESSURE-BASED SENSOR SYSTEM FOR PRECURSOR LEVEL MEASUREMENT AND METHOD THEREFOR

(71) Applicant: ASM IP Holding, B.V., Almere (NL)

(72) Inventors: Kenneth Honniball, Kessel-Lo (BE); Giuseppe Alessio Verni, Vantaa (FI); Viljami Pore, Helsinki (FI)

(73) Assignee: ASM IP Holding B.V., Almere (NL)

( * ) Notice: Subject to any disclaimer, the term of this patent is extended or adjusted under 35 U.S.C. 154(b) by 294 days.

(21) Appl. No.: 18/361,572

(22) Filed: Jul. 28, 2023

(65) Prior Publication Data

US 2024/0044689 A1 Feb. 8, 2024

Related U.S. Application Data

(60) Provisional application No. 63/370,282, filed on Aug. 3, 2022.

(51) Int. Cl.
*G01F 23/14* (2006.01)
*H10P 72/00* (2026.01)
*H10P 14/60* (2026.01)

(52) U.S. Cl.
CPC .......... *G01F 23/14* (2013.01); *H10P 72/0604* (2026.01); *H10P 14/668* (2026.01)

(58) Field of Classification Search
CPC ................................. G01F 22/02; G01F 23/14
USPC .................................. 73/149, 290 B, 861.42
See application file for complete search history.

(56) References Cited

U.S. PATENT DOCUMENTS 3,489,002 A * 1/1970 Thompson .............. G01F 17/00 73/149
3,769,834 A * 11/1973 Fletcher ............... A61B 5/1073 600/587
3,895,519 A * 7/1975 Bouchy ................... G01F 17/00 73/149
5,583,897 A * 12/1996 Hill .......................... G01N 9/02 376/245
6,038,919 A * 3/2000 Schmitt ................... G01F 23/14 73/149
6,990,848 B2 * 1/2006 Dummer ................. G01F 22/02 73/433
9,226,695 B2 * 1/2016 Margalit .............. A61B 5/1073
10,337,902 B2 * 7/2019 Abate ...................... G01F 17/00
10,620,031 B2 * 4/2020 Daito .................. G01F 23/0007
11,604,087 B2 * 3/2023 Youn ......................... F17C 5/06
2008/0050510 A1 * 2/2008 Stevens ............... C23C 16/4482 427/248.1
2010/0305884 A1 * 12/2010 Yudovsky ........... C23C 16/4481 702/50
2015/0007646 A1 * 1/2015 Margalit .............. A61B 5/1073 73/149
2017/0199068 A1 * 7/2017 Abate ...................... G01F 17/00

(Continued)

FOREIGN PATENT DOCUMENTS

CN 105784054 B * 11/2018 ............. G01F 17/00
WO WO-2014096875 A1 * 6/2014 ............. G06F 22/02

*Primary Examiner* — John Fitzgerald
(74) *Attorney, Agent, or Firm* — Banner & Witcoff, Ltd.

(57) ABSTRACT

A pressure-based sensor system is described by which the amount of solid precursor in a precursor vessel for a semiconductor manufacturing process can be determined. The system comprises at least two fluidly connected chambers having a known volume, and a pressure sensor configured to measure a plurality of pressures in said chambers.

20 Claims, 3 Drawing Sheets

(56) References Cited

U.S. PATENT DOCUMENTS

| | | | | |
|---|---|---|---|---|
| 2018/0299315 | A1* | 10/2018 | Crowne | F02C 7/22 |
| 2022/0195595 | A1* | 6/2022 | Zhu | B01D 1/0082 |
| 2024/0035872 | A1* | 2/2024 | Vandalon | G01F 23/26 |
| 2025/0313952 | A1* | 10/2025 | Yednak, III | B05B 1/00 |

* cited by examiner

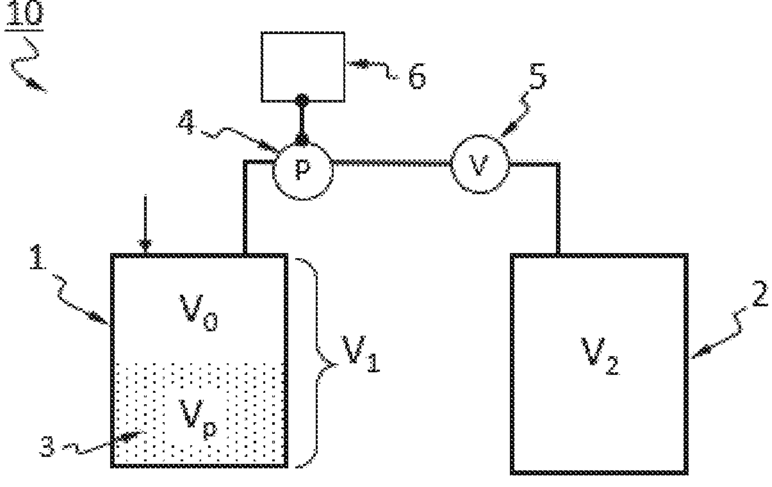
FIG. 1
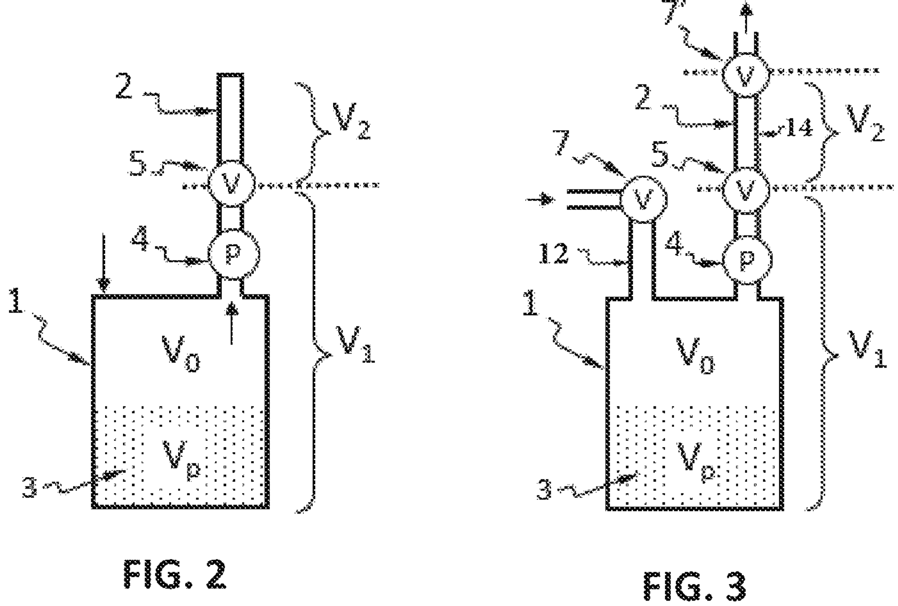
FIG. 2
FIG. 3

PRESSURE-BASED SENSOR SYSTEM FOR PRECURSOR LEVEL MEASUREMENT AND METHOD THEREFOR

CROSS-REFERENCE TO RELATED APPLICATION(S)

This application claims the benefit of U.S. Provisional Application 63/370,282 filed on Aug. 3, 2022, the entire contents of which are incorporated herein by reference.

FIELD

The technology of the present disclosure generally relates to the field of semiconductor processing, and more particularly technology for determining the amount of solid precursor in a precursor vessel for a semiconductor manufacturing process.

BACKGROUND

With semiconductors and semiconductor manufacturing processes becoming more advanced, there is a need for greater uniformity and process control during the manufacturing process.

During processes such as Atomic Layer Deposition (ALD), Epitaxy and Chemical Vapor Deposition (CVD) precursors which may be in the form of a gas, liquid or solid are deposited onto or contacted with a workpiece. These precursors are often stored in precursor container or precursor vessel from where they are transported to the workpiece in the reaction chamber.

While the process is being performed, it may be advantageous to monitor the amount of precursor in the precursor vessel in order to prevent manufacturing defects due to exhaustion of the precursor material. The ability to monitor remaining amount of precursor material in the precursor vessel is important because it ensures process quality, allows efficient scheduling of precursor vessel changes, maximizes use of expensive chemistry, and improves inventory management.

Whereas level sensing is industry standard for gaseous or liquid materials, monitoring the remaining amount of a solid precursor material is more complex. Typically, the precursor material is transported from the precursor vessel to the reactor chamber by flowing a carrier gas through the precursor vessel, thereby generating a process gas comprising the carrier gas and vaporized solid precursor which is subsequently provided to the process chamber. Several of the process conditions employed to the manufacturing process (e.g. high temperature range, the use of carrier gas, and so on) result in the monitoring of the precursor level becoming challenging for existing level sensing systems especially when resolution and accuracy are key.

Therefore, a need exists for an improved method and apparatus for monitoring the amount of solid precursor in a precursor vessel for a semiconductor manufacturing process.

SUMMARY

In the present description, technology is described by means of which the amount of solid precursor in a precursor vessel for a semiconductor manufacturing process can be determined. Specifically, a pressure-based sensor system is described by means of which the amount of solid precursor in a precursor vessel for a semiconductor manufacturing process can be determined, said system comprising at least two fluidly connected chambers having a known volume, and a pressure sensor configured to measure a plurality of pressures in said chambers when a probing gas is supplied thereto.

Reliable sensing of the precursor level in a vessel is key for (resource) planning, error detection, quality assurance, amongst other operating factors. The herein disclosed technology may improve the accuracy and consistency of precursor measurement. Additionally, the herein disclosed technology can be used for out or in-place precursor vessel measurements. The latter are preferred as they can be done without tool downtime. Moreover, because in-place monitoring allows near real-time monitoring, it can also be used for error detection (e.g. precursor flushed away) or quality control. For example, the last 20% of chemical should not be used because the resulting film might be of lower quality due to impurities.

A first overview of various aspects of the technology of the present disclosure is given hereinbelow, after which specific embodiments will be described in more detail. This overview is meant to aid the reader in understanding the technological concepts more quickly, but it is not meant to identify the most important or essential features thereof, nor is it meant to limit the scope of the present disclosure, which is limited only by the claims.

An aspect of the present disclosure relates to a method for determining the amount of solid precursor in a precursor vessel for a semiconductor manufacturing process;

- wherein the precursor vessel comprises a precursor chamber having a known volume, that is configured for receiving and holding of solid precursor; whereby said precursor chamber is fluidly connected to a probing chamber that has a known volume, and a valve configured to control a flow of probing gas from said precursor chamber to said probing chamber;
- wherein the method comprises the steps of:
  - providing a probing gas to the precursor chamber holding an amount of solid precursor to be measured;
  - measuring a first pressure of the probing gas;
  - opening said valve such that probing gas flows from said precursor chamber to said probing chamber;
  - measuring an equilibrium pressure of the probing gas; and,
  - determining the amount of precursor in said precursor vessel based on the plurality of pressure measurements and known chamber volumes.

In some embodiments the method comprises the step of evacuating dead space from said precursor chamber prior to providing the probing gas.

In some embodiments the precursor chamber comprises an inlet that is configured to receive and guide probing gas into a portion of said precursor chamber holding the precursor.

In some embodiments the probing chamber comprises an outlet for said precursor chamber, which is configured to receive and guide probing gas from said precursor chamber when said valve is opened.

In some embodiments the method comprises the step of providing probing gas to the precursor chamber until a pressure of the probing gas equals a predetermined value.

In some embodiments the determining of the amount of precursor comprises calculating, based on the plurality of pressure measurements, a volume of the precursor contained in the precursor chamber, and extrapolating, based on said volume, the amount of precursor in said precursor vessel.

In some embodiments the extrapolating of the amount of precursor comprises looking up a corresponding value in a calibration curve and/or look-up table that describe the relationship between said volume and the amount of precursor.

In some embodiments the precursor chamber is contained in a portion of the precursor vessel, and the probing chamber or part thereof is contained in another portion of said precursor vessel.

In some embodiments the precursor chamber is contained in a portion of the precursor vessel, and the probing chamber or part thereof is positioned outside of said precursor vessel but is fluidly connected thereto.

In some embodiments the temperature of the precursor and probing chambers is substantially the same.

In some embodiments the probing gas comprises or consists of an inert gas; preferably wherein said probing gas comprises or consists of Argon (Ar).

In some embodiments the solid precursor comprises a metal-containing material.

Another aspect of the present disclosure relates to a pressure-based sensor system for measuring the amount of solid or liquid precursor in a precursor vessel for a semiconductor manufacturing process, the system comprising:

- a precursor vessel comprising a precursor chamber having a known volume, which is configured for receiving and holding the precursor;
- a probing chamber having a known volume, which is fluidly connected to said precursor chamber;
- a probing gas source configured to provide a probing gas to said precursor chamber;
- a valve configured to control a flow of probing gas from said precursor chamber to said probing chamber;
- a pressure sensor configured to measure a pressure of the probing gas; and,
- a processing device communicatively coupled to said pressure sensor in order to receive sensing data therefrom and configured to determine, based on said sensing data, the amount of precursor in said precursor vessel based on a plurality of pressure measurements and known chamber volumes; wherein said plurality of pressure measurements includes at least a first measurement when the probing gas is provided to said precursor chamber, and a second measurement when said probing gas reaches equilibrium pressure in said precursor and probing chambers.

In some embodiments the precursor chamber is fluidly connected to the probing chamber by means of a fluid connection; and wherein the valve and the pressure sensor are mounted on said fluid connection.

In some embodiments the pressure sensor is mounted before the valve on said fluid connection such that is fluidly connected to the precursor chamber.

In some embodiments the system comprises a vacuum pump fluidly connected to the precursor chamber, which is configured for evacuating dead space from said precursor chamber.

In some embodiments the system comprises a pressure controller fluidly connected to the precursor chamber, which is configured for providing probing gas to said precursor chamber until a pressure of said probing gas equals a predetermined value.

In some embodiments the system comprises a temperature controller configured for adjusting the temperature of at least one of the precursor or probing chambers, such that the temperature of the precursor and probing chambers is substantially the same.

Another aspect of the present disclosure relates to a deposition system comprising a process chamber, a substrate handling system, and a precursor vessel; wherein

- the precursor vessel has a precursor chamber holding a solid precursor; and,
- the deposition system comprises a pressure-based sensor system as defined above.

In some embodiments the deposition system further comprises a controller, wherein the controller is configured for causing the deposition system to carry out a method according to an embodiment as described in the present disclosure.

BRIEF DESCRIPTION OF THE DRAWINGS

The following description of the figures relates to specific embodiments of the disclosure which are merely exemplary in nature and not intended to limit the present teachings, their application or uses.

Throughout the drawings, the corresponding reference numerals indicate the following parts and features: precursor chamber (1); probing chamber (2); solid precursor (3); pressure sensor (4); probing chamber valve (5); processing unit (6); valve (7); vacuum pump (8); pressure controller (9); pressure-based sensor system (10).

FIG. 1 shows an embodiment of a pressure-based sensor system 10 comprising precursor chamber 1 fluidly connected to probing chamber 2 comprising a fluid chamber.

FIG. 2 shows an embodiment of a pressure-based sensor system 10 comprising precursor chamber 1 fluidly connected to probing chamber 2 comprising a closed pipe.

FIG. 3 shows an embodiment of a pressure-based sensor system 10 comprising precursor chamber 1 fluidly connected to probing chamber 2 comprising an open pipe.

DETAILED DESCRIPTION

Figure 4:
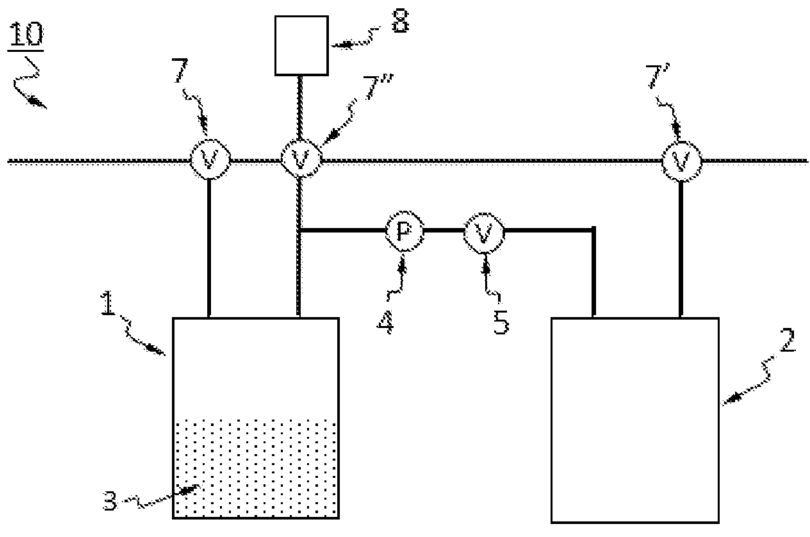
FIG. 4 shows an embodiment of a pressure-based sensor system 10 comprising fluidly connected precursor 1 and probing 2 chambers, and a vacuum pipe 8 connected thereto.

In the following detailed description, the technology underlying the present disclosure will be described by means of different aspects thereof. It will be readily understood that the aspects of the present disclosure, as generally described herein, and illustrated in the figures, can be arranged, substituted, combined, and designed in a wide variety of different configurations, all of which are explicitly contemplated and make part of this disclosure. This description is meant to aid the reader in understanding the technological concepts more easily, but it is not meant to limit the scope of the present disclosure, which is limited only by the claims.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment.

As used herein, the terms "comprising", "comprises" and "comprised of" as used herein are synonymous with "including", "includes" or "containing", "contains", and are inclusive or open-ended and do not exclude additional, non-recited members, elements or method steps. The terms "comprising", "comprises" and "comprised of" when referring to recited members, elements or method steps also include embodiments which "consist of" said recited members, elements or method steps. The singular forms "a", "an", and "the" include both singular and plural referents unless the context clearly dictates otherwise.

As used herein, relative terms, such as "left," "right," "front," "back," "top," "bottom," "over," "under," etc., are used for descriptive purposes and not necessarily for describing permanent relative positions. It is to be understood that such terms are interchangeable under appropriate circumstances and that the embodiment as described herein are capable of operation in other orientations than those illustrated or described herein unless the context clearly dictates otherwise.

Objects described herein as being "adjacent" to each other reflect a spatial relationship between the described objects, that is, the term indicates the described objects must be arranged in a way to perform a designated function which include a direct (i.e. physical) or indirect (i.e. close to or near) physical contact, as appropriate for the context in which the phrase is used.

Objects described herein as being "connected" or "coupled" reflect a functional relationship between the described objects, that is, the terms indicate the described objects must be connected in a way to perform a designated function which may include a direct or indirect connection in an electrical or nonelectrical (i.e. physical) manner, as appropriate for the context in which the term is used.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result.

As used herein, the term "about" is used to provide flexibility to a numerical value or range endpoint by providing that a given value may be "a little above" or "a little below" said value or endpoint, depending on the specific context. Unless otherwise stated, use of the term "about" in accordance with a specific number or numerical range should also be understood to provide support for such numerical terms or range without the term "about". For example, the recitation of "about 30" should be construed as not only providing support for values a little above and a little below 30, but also for the actual numerical value of 30 as well.

The recitation of numerical ranges by endpoints includes all numbers and fractions subsumed within the respective ranges, as well as the recited endpoints. Furthermore, the terms first, second, third and the like in the description and in the claims, are used for distinguishing between similar elements and not necessarily for describing a sequential or chronological order, unless specified. It is to be understood that the terms so used are interchangeable under appropriate circumstances and that the embodiments of the disclosure described herein are capable of operation in other sequences than described or illustrated herein.

Reference in this specification may be made to devices, structures, systems, or methods that provide "improved" performance (e.g. increased or decreased results, depending on the context). It is to be understood that unless otherwise stated, such "improvement" is a measure of a benefit obtained based on a comparison to devices, structures, systems or methods in the prior art. Furthermore, it is to be understood that the degree of improved performance may vary between disclosed embodiments and that no equality or consistency in the amount, degree, or realization of improved performance is to be assumed as universally applicable.

In the present description, technology is described by means of which the amount of solid precursor in a precursor vessel for a semiconductor manufacturing process can be determined. Reliable sensing of the precursor level in a vessel is key for (resource) planning, error detection, quality assurance, amongst other operating factors. The herein disclosed technology may improve the accuracy and consistency of precursor measurement.

Additionally, the herein disclosed technology can be used for out or in-place precursor vessel measurements. The latter are preferred as they can be done without tool downtime. Moreover, because in-place monitoring allows near real-time monitoring, it can also be used for error detection (e.g. precursor flushed away) or quality control. For example, the last 20% of chemical should not be used because the resulting film might be of lower quality due to impurities.

Unless otherwise defined, all terms used in describing the technology, including technical and scientific terms, have the meaning as commonly understood by one of ordinary skill in the art to which this disclosure belongs. By means of further guidance, definitions for the terms used in the description are included to better appreciate the teaching of the present disclosure. The terms or definitions used herein are provided solely to aid in the understanding of the technology.

As referred to herein, the term "solid precursor" refers to the solid chemical compounds used in semiconductor manufacturing techniques, such as CVD and ALD, to be deposited onto the surface of substrate in a thin layer or as an atomic layer, such as a layer having a thickness of at least 0.3 nm to at most 50 nm, or of at least 1 nm to at most 20 nm. The precursor material is selected based on the process performed in the process chamber. Furthermore, the solid precursor may be provided in many forms including powders, granules, but also solids adhered onto an inert scaffolding. Ideally this scaffolding should not interact with the precursor to ensure both quality (precursor altered by the measurement) and safety (heating, sparking, etc.).

In an embodiment the solid precursor may comprise a metal, more particularly, said metal may be selected from an alkaline metal, an alkaline earth metal, a transition metal, a transition metal, a rare earth metal or a combination thereof. The precursor may also comprise one or more ligands, the one or more ligands being selected from H, halogens, alkyls, alkenyls, alkynes, carbonyls, dienyls, beta-diketonates, substituted or unsubstituted cyclodienyls, substituted or unsubstituted aryls or a combination thereof. Suitable halogens include F, Br, Cl, and/or I. Suitable alkyls, alkenyls, alkynes, dienyls, and cyclodienyls are typically C1 to C8 compounds. Suitable substituents on the cyclodienyls and aryls include C1 to C3 alkyls. Suitable beta-diketonates include 1,1,1,5,5,5-hexafluoropentane-2,4-dionate (hfac) and/or 2,4-pentanedione (hacac). In embodiment the precursor may be a homoleptic chemical compound (a metal compound where all ligands are identical) or a heteroleptic chemical compound (a metal compound having two or more different types of ligands). In an embodiment the precursor may comprise a metal-carbon bond. In an embodiment the precursor may comprise a pi complex. An exemplary solid precursor is $HfCl_4$.

It will be observed that the herein described technology is described primarily with reference to solid precursor. The reason for this is that technology for reliable measurement of liquid precursor is known in the art, such as the use of floaters. However, such technology cannot be reliably applied to measurement of solid precursor level, which is more complex due to a lack of definite volume and possible agglomeration (e.g. clumping). Nevertheless, the skilled person appreciates that the herein described technology can also be utilised for measurement of liquid precursor, or a mixture of solid and liquid precursor. For the sake of brevity, however, such embodiments will not be described separately, but they are nevertheless explicitly anticipated within the scope of the present disclosure.

The above-described solid precursor may be typically stored in a "precursor vessel", which may comprise a chamber consisting of a hollow void formed within the body of said precursor vessel. This chamber may include a top, a bottom, and one or more surrounding sidewalls enclosing an interior portion, and an opening for accessing said interior portion. The interior portion may be configured for receiving and holding of the precursor via said opening. The precursor vessel may also be configured to reach and maintain different temperatures within said interior portion depending on the received precursor. Typical temperatures may range between 120° C. to 200° C., but the present disclosure is not limited to any particular temperature range.

The precursor vessel may be part of a "processing system", which typically further comprises a "process chamber" coupled to a "solid delivery system". The process chamber may include an inner volume with a substrate support disposed therein for supporting a substrate to be processed (such as a semiconductor wafer or the like). The process chamber may be configured for ALD, CVD, or the like. The processing system may comprise additional components, for example, one or more RF or other energy sources for generating a plasma within the inner volume or for providing RF bias to a substrate disposed on the substrate support.

Further, the solid delivery system may comprise a gas source and a precursor vessel configured for receiving and holding of a precursor. The gas source may be coupled to the process chamber for providing one or more process gases to the inner volume of the chamber. In some embodiments the gas source may include a mass flow controller or other suitable device for controlling the quantity of gas provided from the gas source. Alternatively or in combination, the gas source may be coupled to a mass flow controller or other suitable device for controlling the quantity of gas provided from the gas source. The process gases may enter the chamber via an inlet, such as a showerhead, a nozzle, or other suitable gas inlet apparatus. Unreacted process gases, gas by-products, or like may be removed from the inner volume via an exhaust system coupled to the chamber.

An overview of various aspects of the technology of the present disclosure is given hereinbelow, after which specific embodiments will be described in more detail. This overview is meant to aid the reader in understanding the technological concepts more quickly, but it is not meant to identify the most important or essential features thereof, nor is it meant to limit the scope of the present disclosure, which is limited only by the claims. When describing specific embodiments, reference is made to the accompanying drawings, which are provided solely to aid in the understanding of the described embodiment.

An aspect of the present disclosure relates to a method for determining the amount of solid precursor in a precursor vessel for a semiconductor manufacturing process;

wherein the precursor vessel comprises a first chamber having a known volume, that is configured for receiving and holding precursor, referred to hereinbelow as a "precursor chamber"; whereby said precursor chamber is fluidly connected to a second chamber having a known volume, that is configured for receiving probing gas from said precursor chamber, referred to hereinbelow as a "probing chamber"; and a valve configured to control a flow of probing gas from said precursor chamber to said probing chamber; wherein the method comprises the steps of:

- providing a probing gas to the precursor chamber holding an amount of solid precursor to be measured;
- measuring a first pressure of the probing gas;
- opening said valve such that probing gas flows from said precursor chamber to said probing chamber;
- measuring an equilibrium pressure of the probing gas; and,
- determining the amount of precursor in said precursor vessel based on the plurality of pressure measurements and known chamber volumes.

Another aspect of the present disclosure relates to a pressure-based sensor system for measuring the amount of solid or liquid precursor in a precursor vessel for a semiconductor manufacturing process, the system comprising:

- a precursor vessel comprising a precursor chamber having a known volume, which is configured for receiving and holding the precursor;
- a probing chamber having a known volume, which is fluidly connected to said precursor chamber;
- a probing gas source configured to provide a probing gas to said precursor chamber;
- a valve configured to control a flow of probing gas from said precursor chamber to said probing chamber;
- a pressure sensor configured to measure a pressure of the probing gas; and,
- a processing device communicatively coupled to said pressure sensor in order to receive sensing data therefrom and configured to determine, based on said sensing data, the amount of precursor in the precursor vessel based on a plurality of pressure measurements and known chamber volumes; wherein said plurality of pressure measurements includes at least a first measurement when the probing gas is provided to said precursor chamber and a second measurement when the probing gas reaches equilibrium pressure in said first and probing chambers.

Another aspect of the present disclosure relates to a processing system comprising a process chamber, a substrate handling system, and a precursor vessel; wherein the precursor vessel holds a solid precursor; and, the deposition system comprises a pressure-based sensor system according to an embodiment as described in the present disclosure, preferably configured for carrying out a method according to an embodiment as described in the present disclosure.

The pressure-based sensor system 10 of the present disclosure is discussed in more detail with reference to FIG. 1, which schematically shows an embodiment of two fluid fluidly connected chambers, whereby a first precursor chamber 1 has a known volume $V_1$ and a second probing chamber 2 has a known volume $V_2$. Precursor chamber 1 is shown to hold an amount of solid precursor 3 of an unknown volume $V_p$. and a corresponding amount of dead space of unknown volume $V_0$, whereby $V_1=V_p+V_0$. As referred to herein, "dead space" is a portion of the precursor chamber that does not contain solid precursor or at most contains a negligible amount of precursor, possibly in a different phase than solid (e.g. vapour).

It is further shown that valve 5 is mounted on the fluidic connection—represented by a solid line—connecting precursor chamber 1 to probing chamber 2, such that the connection between said chambers can be closed or opened to allow free passage of gas from one chamber to the other. The skilled person understands that the fluidic connection has a certain volume, but for ease of explanation this additional volume is regarded as negligible.

By applying the principle of Boyle's free law, which states at a constant temperature the volume of a given mass of gas is inversely proportional to its pressure, the unknown precursor volume $V_p$ can be determined by supplying a probing gas into the fluidly connected chambers and performing a plurality of pressure measurement measurements at different volumes. A detailed explanation will be given hereinbelow.

In an embodiment the probing gas may comprise or consists of an inert gas. As used herein, "inert gas" refers to a gas that does not chemically react and advantageously mix with the solid precursor. Suitable inert gasses include noble gasses such as He, Ne, Ar, Xe, and Kr. In some embodiments, suitable inert gasses can include one or more of $H_2$ and $N_2$. Preferably, the probing gas may comprise or consist of a noble gas such as Argon (Ar), which is particularly suitable for precursor materials utilised in semiconductor processing.

Referring again to FIG. 1, to perform a first pressure measurement valve 5 is closed such that no gas is able to pass from precursor chamber 1 to probing chamber 2. Next, a probing gas is provided to the precursor chamber 1 via an opening (indicated by the arrow) such that said gas can expand throughout the dead space $V_0$ of said chamber 1 to set a first pressure $p_1$. In the present embodiment pressure $p_1$ is measured by pressure sensor 4 arranged along the fluid connection line before valve 5; any opening to precursor chamber 1 is closed to prevent pressure fluctuations.

For the second measurement, valve 5 is opened such that the probing gas can flow from precursor chamber 1 to empty probing chamber 2 as a result of the difference in pressure between now connected chambers. Once the probing gas reaches an equilibrium pressure, a second pressure $p_2$ can be measured by pressure sensor 4. The time required for reaching equilibrium pressure depends on the probing gas used and the volumes of both chambers.

By taking into account the measured values of the plurality of pressure measurements, including at least pressure measurements $p_1$. and $p_2$, and the values known beforehand of the chamber volumes, including at least volumes $V_1$ and $V_2$, the value of $V_p$ can be calculated as follows:

$$V_p=V_1-[(p_2V_2)/(p_1-p_2)].$$

Nonetheless, when practically implementing the above-described principles, the presence of various fluid connections, such as tubes/pipes, and other connecting elements, such as valves, might be required for process control. Such connections will have a volume that may be considered as part of the chambers. Also, the skilled person may appreciate that the present system does not require the presence of a "chamber" in the strict sense of a word, but may include any type of container suitable for allowing for sufficient expansion of probing gas such that a difference in pressure can be measured across different volumes.

In an embodiment a chamber may comprise a fluid chamber and one or more fluid connections connected thereto, whereby the chamber volume corresponds to the summation of volumes of components of said chamber, specifically the volume of the fluid chamber and the volume of the one or more fluid connections. For example, a probing gas chamber of $V_2$ may comprise a fluid chamber and a fluid connection extending from a valve up to said fluid chamber, such that $V_2$=V fluid chamber+V fluid connection.

In another embodiment the chamber may consist of one or more fluid connections having a known volume, whereby the probing chamber volume corresponds to the summation of volumes of components of said probing chamber. For example, a probing gas chamber of $V_2$ may comprise a fluid connection extending from a valve up to a blocking element, such that $V_2$=V of said fluid connection.

An example of the latter embodiment is shown in FIG. 2, which shows the probing chamber 2 comprising a closed pipe arranged after valve 5, that controls a flow of probing gas from the precursor chamber 1 to said probing chamber 2. Accordingly, volume $V_2$ of probing chamber 2 will correspond to the length and diameter of said pipe. Pressure $p_1$ can be measured by providing probing gas into precursor chamber 1 while valve 5 is closed. Pressure $p_2$ can then be measured by opening valve 5 while valve 7 is closed.

The same embodiments may be applied to the configuration of the precursor chamber. However, the precursor chamber will typically comprise at least a fluid chamber for storing solid precursor. Nonetheless, volume $V_1$ of a precursor chamber may further comprise a number of fluid connections connected to said fluid chamber, such as inlets and outlets, required for proper process control of the precursor vessel.

An example of such an embodiment is shown in FIG. 3, which shows precursor chamber 1 further comprising an inlet pipe 12 forming an opening through which the probing gas can flow into the main fluid chamber storing the precursor. The inlet pipe 12 comprises valve 7 controlling a flow of probing gas into said precursor chamber 1 from an external line or precursor gas source. Accordingly, volume $V_1$ of precursor chamber 1 will further include the volume of said inlet pipe 12, based on said pipe's length and diameter of said pipe. Pressure pi can be measured with pressure sensor 4 by closing valve 5 and valve 7 after providing probing gas into precursor chamber 1.

FIG. 3 further shows that probing chamber 2 may form or be part of an outlet 14 of the precursor chamber 1. Specifically, probing chamber 2 comprises an open pipe arranged between valve 5, controlling a flow of probing gas from the precursor chamber 1 to said probing chamber 2, and valve 7', controlling a flow of probing gas from said probing chamber 2 to an external line. Pressure $p_2$ can be measured with pressure sensor 4 by opening valve 5 while valves 7, 7' are closed.

Further, by opening valve 7' after measuring pressure $p_2$ the probing gas can be removed from the precursor chamber 1 and optionally from probing chamber 2. Such an arrangement thereby allows for reusing the probing gas in a later measurement or another purpose.

In an embodiment the precursor chamber may comprise an inlet that is configured to guide probing gas into a portion of the precursor chamber holding the precursor, preferably when a valve is opened.

In an embodiment the precursor chamber may comprise an outlet that is configured to guide probing gas to the probing chamber from a portion of the precursor chamber holding the precursor, preferably when a valve is opened.

In an embodiment the probing chamber may comprise an inlet that is configured to receive and guide probing gas from the precursor chamber, preferably when a valve is opened.

In an embodiment the probing chamber may comprise an outlet for the precursor chamber, which is configured to guide probing gas to the probing chamber from said precursor chamber when a valve is opened.

Referring back to FIG. 1, it is shown that system 10 further comprises processing device 6, which is electrically coupled to pressure sensor 4 to receive an electrical signal therefrom indicative of pressure measurement—indicated by the solid line with bullet endings. This electrical signal generated by the pressure sensor is hereinafter referred to as sensing data. It is understood that the shown electrical connection is for illustrative purposes only as various forms of connections known in the art could be implemented, direct or indirect. Advantageously, the connections may be adapted for better integration within a precursor vessel. Moreover, processing device 6 is illustrated as positioned adjacent to precursor chamber 1, but embodiments may be contemplated whereby the processing device is spaced away from said precursor chamber 1 or even arranged outside of the precursor vessel.

The processing device is illustrated as a single unit. The skilled person, however, understands that the controller may comprise various components for controlling the operation thereof. The processing device generally comprises a central processing unit (CPU), a memory, and support circuits for the CPU. The controller may be one of any form of general-purpose computer processor that can be used in an industrial setting for controlling various chambers and sub-processors. The memory, or computer-readable medium of the CPU may be one or more of readily available memory such as random-access memory (RAM), read only memory (ROM), hard disk, flash, or any other form of digital storage, local or remote. The support circuits are coupled to the CPU for supporting the processor in a conventional manner. These circuits include cache, power supplies, clock circuits, input/output circuitry and subsystems, and the like.

Based on the received sensing data, the processing device may be configured to determine the amount of precursor in said precursor vessel. Moreover, based on the determined amount, the processing may be configured to determine various parameters relevant to process control. Hereinunder various embodiments of the processing device will be described, but the present disclosure is not limited thereto as new or alternative data processing techniques can be easily implemented in the form of software.

In an embodiment the processing device may be configured for determining the amount of precursor in said precursor vessel by calculating, based on said sensing data, the fraction of said vessel's interior portion which contains precursor, and extrapolating, based on said fraction, said amount of precursor in said precursor vessel. In typical operation, the time to refill or vessel swap may be determined based on the fraction or precursor level. Active monitoring the amount of precursor can thereby allow for a timely intervention such that high process efficiency can be maintained without risking low precursor level.

In an embodiment the volume percentage of fill (when filling the vessel with the initial quantity of precursor) may be known. Therefore, it may be sufficient to just know the precursor volume as the mass can then be calculated based on the measurement. Nonetheless, in an alternative embodiment wherein the volume percentage of fill is at least partially unknown, for example due to (human) error, the mass can be calculated based on calibration data from reference measurements.

In an embodiment the extrapolating of an amount of precursor may comprise looking up a corresponding value in a calibration curve and/or look-up table that describes the relationship between said fraction and the amount of precursor in said precursor vessel. Preferably, the calibration curve and/or look-up table can be generated beforehand by measuring a weight of the precursor at different fractions, and determining the amount of precursor based on said measured weight and/or the precursor volume.

In an embodiment the processing device may be configured for calculating a consumption or consumption rate (mg/s dosing or mg/per pulse) of said precursor based on said sensing data over time. Monitoring consumption may be advantageous for quality control. For example, a higher/lower than normal consumption can indicate tool issues, such as dumping of precursor due to (human) error in operating the tool/valves, or the carrier flow picking up the chemical may be out of spec due to a faulty flow controller/sensor. Such tool issue can be easily detected by monitoring the consumption rate and comparing it to a predefined (normal) consumption rate value. The monitoring can be automated based on the controller configuration.

In an embodiment, the dead space $V_0$ may be evacuated before providing probing gas into the precursor chamber. This has the advantage of improving measurement reliability by ensuring that the dead space does not contain traces of other gas, such as vapourised precursor, which could impact the pressure measurement when probing gas is provided into said system.

An example of such an embodiment is shown in FIG. 4, which shows system 10 further comprising vacuum pump 8 fluidly connected to precursor chamber 1, that is configured to evacuate dead space from said precursor chamber 1. Specifically, precursor chamber 1 can be evacuated with vacuum pump 8 by opening valve 7" while closing valves 7, 7' and optionally valve 5. Afterwards closing valve 7" allows for performing the above-described method.

Additionally, the line between valves 7 to 7' can be depressurised with the vacuum pump 8 such probing gas left in the probing chamber can be evacuated upon opening valve 7'. The skilled person understands that other lines and components can be introduced to capture the probing gas and/or redirect it into the precursor chamber for another measurement.

In an embodiment, the probing gas may be provided to the precursor chamber at a predetermined pressure value. Specifically, pressurised probing gas may flow into said precursor chamber while monitoring the pressure until a desired pressure value is reached at which point the gas flow can be terminated, for example by closing an inlet valve. Advantageously sufficient gas pressure can be created using a compressor. This embodiment can be used to replace the first pressure measurement $p_1$, since the pressure of the probing gas will be already known beforehand. As a result, the measurement time can be decreased.

Moreover, the provision of pressurised probing gas may allow a rearrangement of the system components for reduced complexity. In an embodiment the pressure sensor can be arranged outside the precursor chamber since it is no longer required for the first measurement. This could allow for an easier to design system because the pressure sensor can be mounted at a position that allows easier integration and connection, inside or outside of the precursor vessel.

Figure 5:
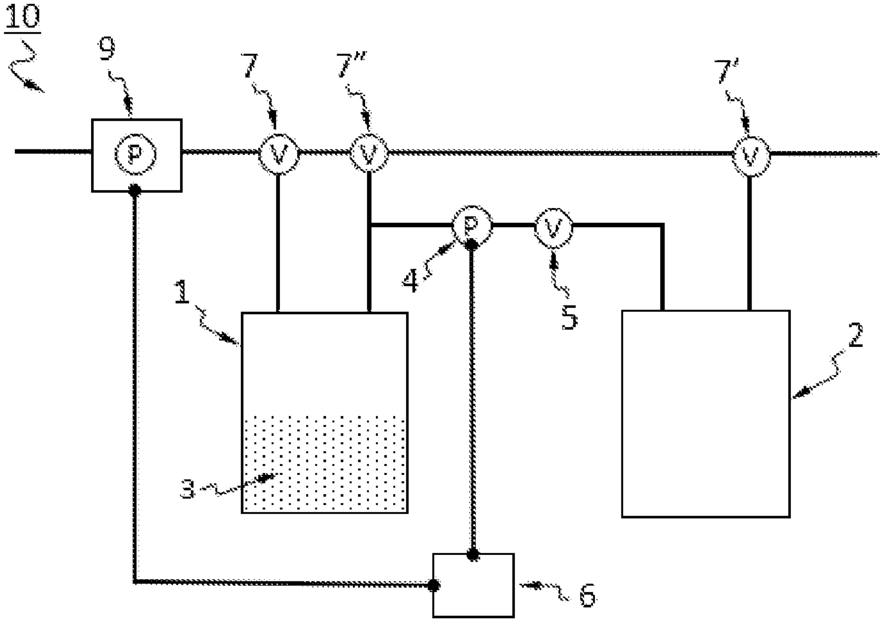
FIG. 5 shows an embodiment of a pressure-based sensor system 10 comprising fluidly connected precursor 1 and probing 2 chambers, and a pressure controller 9 connected thereto.

An example of such an embodiment is shown in FIG. 5, which shows system 10 further comprising pressure controller 9 configured for providing probing gas to said precursor chamber until a pressure of said probing gas equals a predetermined value. In the shown example the pressure controller 9 is arranged adjacent to an inlet of precursor chamber 1. The skilled person, however, understands that the controller can be mounted at a different position along or outside the line, inside or even outside of the precursor vessel.

FIG. 5 further shows that pressure controller 9 may be operationally coupled to the processing device, such that the applied probing gas pressure can be directly input to the processing device for calculations. Alternatively or in combination, the processing device may be configured to control operation of the pressure controller by providing a desired pressure value as input thereto.

In an embodiment the precursor chamber may be contained in a portion of the precursor vessel and the probing chamber or part thereof may be contained in another portion of said precursor vessel.

In an embodiment the precursor chamber may be contained in a portion of the precursor vessel and the probing chamber or part thereof may be positioned outside of said precursor vessel but fluidly connected thereto.

In an embodiment the system may comprise a temperature sensor configured for determining the temperature of the precursor, advantageously by measuring the temperature within the interior portion holding said precursor. The processing device may be further configured to receive temperature data from said temperature sensor and adjust a calculation of the precursor amount based on said temperature data. The provision of a temperature sensor may increase the sensing accuracy for temperatures that cause fluctuations in the precursor phase. However, for temperatures below 400° C., typically only a minor fraction of the liquid/solid is in the vapor phase in the vessel. Hence, the provision of a temperature sensor can be advantageously contemplated for higher temperature, depending on the precursor type, but may be redundant for lower temperatures.

In an embodiment the system the system may comprise a temperature controller configured to adjust the temperature of at least one chamber, preferably the precursor chamber and/or probing chamber, and optionally any connections thereto. Advantageously, the chamber temperature will be adjusted (cooled/heated) such that the temperature is the same, or at most have a temperature different within a (negligible) margin of error. For example, for a difference of 1 or 2° C., any difference in temperature can be disregarded.

Figure 6:
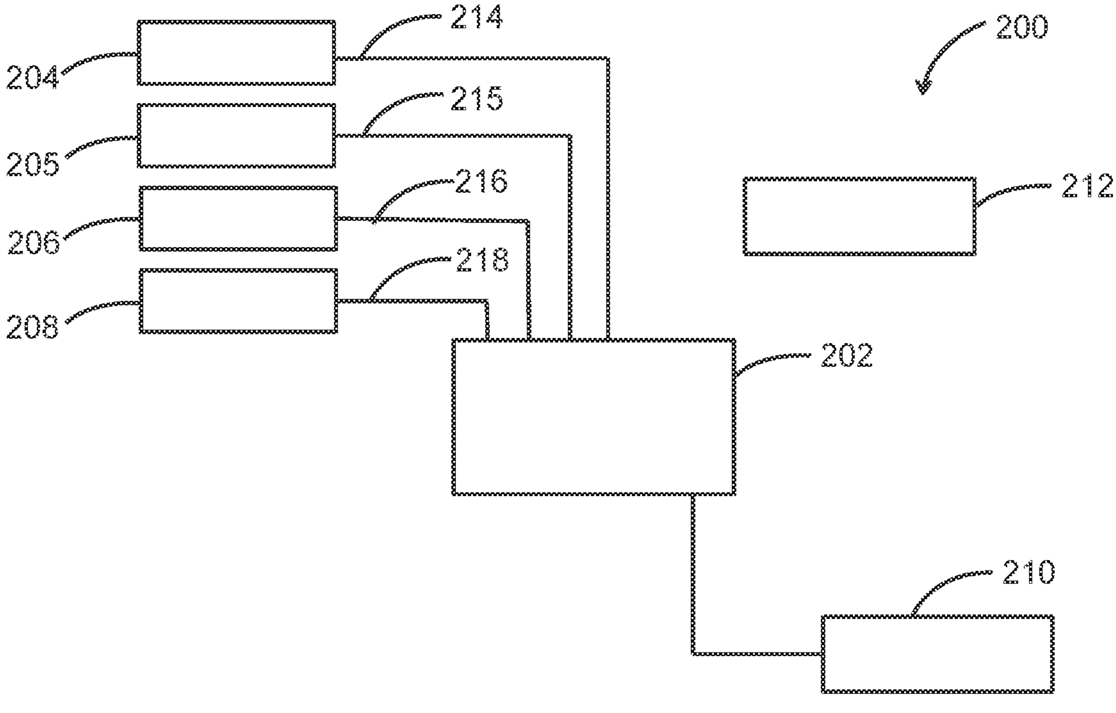
FIG. 6 shows an embodiment of a processing system 200 comprising one or more process chambers 202, a precursor gas source 204, a gas source 205, a reactant gas source 206, a purge gas source 208, an exhaust 210, and a process control unit 212.

An exemplary system as described herein is shown in FIG. 6. FIG. 6 illustrates a system (200) in accordance with yet additional exemplary embodiments of the disclosure. The system (200) can be used to perform a method as described herein and/or form a structure or device portion as described herein.

In the illustrated example, the system (200) includes one or more reaction chambers (202), a precursor gas source (204), a reactant gas source (206), a purge gas source (208), an exhaust (210), and a controller (212).

The reaction chamber (202) can include any suitable reaction chamber, such as an ALD or CVD reaction chamber.

The precursor gas source (204) can include a vessel and one or more precursors as described herein—alone or mixed with one or more carrier (e.g., noble) gases. The reactant gas source (206) can include a vessel and one or more reactants as described herein—alone or mixed with one or more carrier gases. The purge gas source (208) can include one or more noble gases such as He, Ne, Ar, Kr, or Xe. Although illustrated with four gas sources (204)-(208), the system (200) can include any suitable number of gas sources. The gas sources (204)-(208) can be coupled to reaction chamber (202) via lines (214)-(218), which can each include flow controllers, valves, heaters, and the like. Suitably, the system (200) comprises the pressure-based sensor system for measuring the amount of solid or liquid precursor in a precursor vessel as described herein and/or as shown in any one of FIGS. 1 to 5.

The exhaust (210) can include one or more vacuum pumps.

The controller (212) includes electronic circuitry and software to selectively operate valves, manifolds, heaters, pumps and other components included in the system (200). Such circuitry and components operate to introduce precursors and purge gases from the respective sources (204)-(208). The controller (212) can control timing of gas pulse sequences, temperature of the substrate and/or reaction chamber, pressure within the reaction chamber, and various other operations to provide proper operation of the system (200). The controller (212) can include control software to electrically or pneumatically control valves to control flow of precursors, reactants and purge gases into and out of the reaction chamber (202). The controller (212) can include modules such as a software or hardware component, e.g., a FPGA or ASIC, which performs certain tasks. A module can advantageously be configured to reside on the addressable storage medium of the control system and be configured to execute one or more processes.

Other configurations of the system (200) are possible, including different numbers and kinds of precursor and reactant sources and purge gas sources. Further, it will be appreciated that there are many arrangements of valves, conduits, precursor sources, and purge gas sources that may be used to accomplish the goal of selectively feeding gases into the reaction chamber (202). Further, as a schematic representation of a system, many components have been omitted for simplicity of illustration, and such components may include, for example, various valves, manifolds, purifiers, heaters, containers, vents, and/or bypasses.

During operation of the reactor system (200), substrates, such as semiconductor wafers (not illustrated), are transferred from, e.g., a substrate handling system to the reaction chamber (202). Once substrate(s) are transferred to the reaction chamber (202), one or more gases from the gas sources (204)-(208), such as precursors, reactants, carrier gases, and/or purge gases, are introduced into the reaction chamber (202).

The invention claimed is:

1. Method for determining an amount of solid precursor in a pressure-based sensor system for a semiconductor manufacturing process, wherein the system comprises a precursor chamber having a known volume, the precursor chamber configured for receiving and holding the solid precursor and being fluidly connected to a probing chamber that has a known volume, a valve configured to control a flow of a probing gas from said precursor chamber to said probing chamber, and an inlet pipe configured to receive and guide the probing gas, from a probing gas source, into a portion of said precursor chamber holding the solid precursor, wherein the method comprises the steps of:

providing the probing gas, via the inlet pipe, to the precursor chamber holding the amount of the solid precursor to be measured;

measuring a first pressure of the probing gas;

opening said valve such that the probing gas flows from said precursor chamber to said probing chamber;

measuring an equilibrium pressure of the probing gas; and determining the amount of the solid precursor in the system based on: the measured first pressure, the measured equilibrium pressure, a volume of the inlet pipe, and an extrapolated value from a calibration curve describing a relationship between a volume of the solid precursor contained in the precursor chamber and the amount of the solid precursor.

2. The method according to claim 1, wherein the method comprises the step of evacuating dead space from said precursor chamber prior to providing the probing gas.

3. The method according to claim 1, wherein the probing chamber comprises an outlet for said precursor chamber, which is configured to receive and guide the probing gas from said precursor chamber when said valve is opened.

4. The method according to claim 1, wherein the method comprises the step of providing the probing gas to the precursor chamber until a pressure of the probing gas equals a predetermined value.

5. The method according to claim 1, wherein determining the amount of the solid precursor comprises calculating, based on the measured first pressure, the measured equilibrium pressure, the volume of the solid precursor contained in the precursor chamber, and extrapolating, based on said volume, the amount of the solid precursor in the system.

6. The method according to claim 1, wherein the precursor chamber is contained in a portion of the system, and the probing chamber or part thereof is contained in another portion of the system.

7. The method according to claim 1, wherein the precursor chamber is contained in a portion of the system, and the probing chamber or part thereof is positioned outside of the precursor chamber but is fluidly connected thereto.

8. The method according to claim 1, wherein a temperature of the precursor chamber and a temperature of the probing chamber are substantially the same.

9. The method according to claim 1, wherein the probing gas comprises or consists of an inert gas, wherein said probing gas comprises or consists of Argon.

10. The method according to claim 1, wherein the solid precursor comprises a metal-containing material.

11. The method according to claim 1, wherein the calibration curve is generated by measuring a weight of the solid precursor at different fractions of a total interior volume of the precursor chamber.

12. The method according to claim 1, further comprising:

removing, in response to measuring the first pressure, traces of other gas from said precursor chamber.

13. Pressure-based sensor system for measuring an amount of solid or liquid precursor therein for a semiconductor manufacturing process, the system comprising:

a precursor chamber having a known volume, which is configured for receiving and holding the precursor;

a probing chamber having a known volume, which is fluidly connected to said precursor chamber;

a probing gas source configured to provide a probing gas to said precursor chamber;

an inlet pipe configured to receive and guide probing gas from the probing gas source into a portion of said precursor chamber holding the precursor;

a valve configured to control a flow of probing gas from said precursor chamber to said probing chamber;

a pressure sensor configured to measure a pressure of the probing gas; and a processing device communicatively coupled to said pressure sensor in order to receive sensing data therefrom and configured to determine, based on said sensing data, the amount of precursor in the system based: on a plurality of pressure measurements, an extrapolated value from a calibration curve describing a relationship between a volume of the precursor contained in said precursor chamber and the amount of precursor, and known chamber volumes including a volume of the inlet pipe based on length and diameter of the inlet pipe, wherein said plurality of pressure measurements includes at least a first measurement when the probing gas is provided to said precursor chamber, and a second measurement when said probing gas reaches equilibrium pressure in said precursor chamber and said probing chamber.

14. The system according to claim 13, wherein the system comprises a vacuum pump fluidly connected to the precursor chamber, which is configured for evacuating dead space from said precursor chamber.

15. The system according to claim 13, wherein the system comprises a pressure controller fluidly connected to the precursor chamber, which is configured for providing probing gas to said precursor chamber until a pressure of said probing gas equals a predetermined value.

16. The system according to claim 13, wherein the system comprises a temperature controller configured for adjusting temperature of at least one of the precursor chamber or the probing chamber, such that the temperature of the precursor chamber and the temperature of the probing chamber are substantially the same.

17. The system according to claim 13, wherein the precursor chamber is fluidly connected to the probing chamber by a fluid connection; and wherein the valve and the pressure sensor are mounted on said fluid connection.

18. The system according to claim 17, wherein the pressure sensor is mounted between the valve and the precursor chamber on said fluid connection.

19. Deposition system comprising:

a process chamber, a substrate handling system, and a pressure-based sensor system according to claim 13.

20. The deposition system according to claim 19 further comprising a controller, wherein the controller is configured for causing the deposition system to carry out a method comprising:

providing a probing gas to the precursor chamber holding an amount of solid precursor to be measured;

measuring a first pressure of the probing gas;

opening said valve such that probing gas flows from said precursor chamber to said probing chamber;

measuring an equilibrium pressure of the probing gas; and determining the amount of the solid precursor in the pressure-based sensor system based on the measured first pressure, the measured equilibrium pressure and the known chamber volumes.

* * * * *